US010317068B2

(12) United States Patent
Hong et al.

(10) Patent No.: US 10,317,068 B2
(45) Date of Patent: Jun. 11, 2019

(54) LIGHT SOURCE MODULE

(71) Applicant: LG ELECTRONICS INC., Seoul (KR)

(72) Inventors: Jaepyo Hong, Seoul (KR); Jaechan Kim, Seoul (KR); Injoong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 248 days.

(21) Appl. No.: 15/339,066

(22) Filed: Oct. 31, 2016

(65) Prior Publication Data

US 2017/0167714 A1    Jun. 15, 2017

(30) Foreign Application Priority Data

Dec. 14, 2015 (KR) .................. 10-2015-0178627
Jul. 21, 2016 (KR) .................. 10-2016-0092808

(51) Int. Cl.

| H01J 1/02 | (2006.01) |
| F21V 29/74 | (2015.01) |
| F21V 5/04 | (2006.01) |
| F21V 23/00 | (2015.01) |
| H01L 33/36 | (2010.01) |

(Continued)

(52) U.S. Cl.
CPC ............... *F21V 29/74* (2015.01); *F21K 9/00* (2013.01); *F21V 5/04* (2013.01); *F21V 23/001* (2013.01); *F21V 29/763* (2015.01); *F21V 29/83* (2015.01); *H01L 33/36* (2013.01); *H01L 33/58* (2013.01); *H01L 33/62* (2013.01); *H01L 33/64* (2013.01); *H01L 33/642* (2013.01); *H01L 33/647* (2013.01); *H05K 1/053* (2013.01); *F21V 5/007* (2013.01); *F21V 23/06* (2013.01); *F21W 2131/103* (2013.01); *F21Y 2105/10* (2016.08); *F21Y 2113/00* (2013.01); *F21Y 2115/10* (2016.08); *H05K 1/0209* (2013.01); *H05K 3/107* (2013.01); *H05K 2201/0338* (2013.01); *H05K 2201/10106* (2013.01); *H05K 2201/10969* (2013.01); *H05K 2203/1355* (2013.01)

(58) Field of Classification Search
USPC ..................................................... 313/45, 46
See application file for complete search history.

(56) References Cited

U.S. PATENT DOCUMENTS

| 2005/0122018 A1 | 6/2005 | Morris |
| 2011/0291149 A1 | 12/2011 | Sugizaki et al. |
| 2015/0146422 A1 | 5/2015 | Kwak et al. |

FOREIGN PATENT DOCUMENTS

| DE | 102012218413 A1 | 4/2014 |
| EP | 2365550 A2 | 9/2011 |
| EP | 2608640 A2 | 6/2013 |
| JP | 2-67851 A | 11/1990 |
| JP | 2001-57406 A | 2/2001 |
| JP | 2006-310177 A | 11/2006 |

(Continued)

*Primary Examiner* — Vip Patel
(74) *Attorney, Agent, or Firm* — Birch, Stewart, Kolasch & Birch, LLP

(57) ABSTRACT

A light source module includes a light source for emitting light, and a heat sink for absorbing heat from the light source and dissipating the heat to the outside. The heat sink includes a mounting part for attaching the light source, and a heat dissipation fin for absorbing heat generated by the light source and dissipating the heat to the outside. An electrical insulating layer is provided on at least one surface of the heat sink, and an electrically conductive layer is provided in the insulating layer. The electrically conductive layer provides a path through which electric current is applied to the light source. A lens cover is provided over the light source.

20 Claims, 13 Drawing Sheets

(51) Int. Cl.
*H01L 33/58* (2010.01)
*H01L 33/62* (2010.01)
*H01L 33/64* (2010.01)
*F21K 9/00* (2016.01)
*H05K 1/05* (2006.01)
*F21V 29/76* (2015.01)
*F21V 29/83* (2015.01)
*F21Y 115/10* (2016.01)
*F21V 5/00* (2018.01)
*F21V 23/06* (2006.01)
*H05K 1/02* (2006.01)
*H05K 3/10* (2006.01)
*F21W 131/103* (2006.01)
*F21Y 113/00* (2016.01)
*F21Y 105/10* (2016.01)

(56) References Cited

FOREIGN PATENT DOCUMENTS

| | | |
|---|---|---|
| KR | 10-2005-0114880 A | 11/2006 |
| KR | 10-0787089 B1 | 12/2007 |
| KR | 10-2011-0101565 A | 9/2011 |
| KR | 10-1071089 B1 | 10/2011 |
| KR | 10-1101241 B1 | 1/2012 |
| KR | 10-1148127 B1 | 5/2012 |
| KR | 10-2013-0020320 A | 2/2013 |
| KR | 10-2013-0049452 A | 5/2013 |
| KR | 10-2013-0051553 A | 5/2013 |
| KR | 10-2013-0055121 A | 5/2013 |
| KR | 10-2013-0127213 A | 11/2013 |
| KR | 10-1472403 B1 | 12/2014 |
| KR | 10-2015-0030552 A | 3/2015 |
| KR | 10-2015-0060499 A | 6/2015 |
| KR | 10-2015-0081121 A | 7/2015 |
| KR | 10-2015-0115447 A | 10/2015 |
| WO | WO 2014/163242 A1 | 10/2014 |

LIGHT SOURCE MODULE

CROSS-REFERENCE TO RELATED APPLICATIONS

The present application claims priority under 35 U.S.C. § 119(a) and 35 U.S.C. § 365(b) of Korean Patent Application Nos. 10-2015-0178627 filed on Dec. 14, 2015 and 10-2016-0092808 filed on Jul. 21, 2016, which are hereby incorporated by reference in their entirety.

BACKGROUND

The present disclosure relates to a light source module.

In general, incandescent bulbs or fluorescent lamps are frequently used as indoor or outdoor lighting devices. However, the lifespan of the incandescent bulbs or the fluorescent lamps is short, and therefore, it is necessary to frequently replace the incandescent bulbs or the fluorescent lamps with new ones. The fluorescent lamps can be used for a long period of time as compared with the incandescent bulbs. However, the fluorescent lamps are harmful to the environment. In addition, the fluorescent lamps are deteriorated over time, and therefore, the illumination intensity of the fluorescent lamps is gradually reduced.

In order to solve these problems, there has been proposed a light emitting diode (LED) capable of exhibiting excellent controllability, rapid response speed, high electric/light conversion efficiency, long lifespan, low power consumption, high luminance, and emotional lighting. Also, there have been developed various types of lighting modules and lighting devices employing the LED.

The LED is a semiconductor device that coverts electric energy into light. The LED has advantages of low power consumption, semi-permanent lifespan, rapid response speed, safety, and environmental friendly properties as compared with existing light sources such as fluorescent lamps and incandescent bulbs. For these reasons, much research has been conducted to replace the existing light sources with the LED. Furthermore, the LED has been increasingly used as light sources of lighting devices, such as various liquid crystal displays, electric bulletin boards, and streetlights, which are used indoors and outdoors.

A light emitting device (hereinafter, the light emitting device is mainly referred to as an LED, but the present disclosure is not limited thereto) is used in the form of a plurality of light emitting devices that are integrated to implement high luminance. Thus, the light emitting device is fabricated in the form of a light source module for improving assembly convenience and protecting the light emitting device from external impact and moisture. In the light source module, a plurality of light emitting devices are integrated with high density, and hence higher luminance can be realized. However, heat of a high temperature is generated as a side effect. Accordingly, much research has been conducted to effectively dissipate heat from the light emitting module.

Under the circumstances, Korean Patent Registration No. 10-1472403 filed and registered by the present applicant has disclosed a light source module for solving the problem of heat dissipation.

The light source module above is fabricated by coupling, to a heat sink, a printed circuit board (PCB) having a plurality of light emitting devices mounted thereon. However, such a fabrication method requires a plurality of processes. For this reason, fabrication time is increased, and much cost is required. In order to improve heat dissipation efficiency, a thermal pad is further inserted between the printed circuit board and the heat sink. However, the heat transfer property of the printed circuit board is not excellent, and hence heat is not effectively transferred to the heat sink. As a result, the problem of heat dissipation, which occurs in high-luminance light source modules, is not solved. In addition, it is necessary to separately insert the thermal pad, and hence cost and time are further required.

It is important to enable lighting devices to emit brighter light. However, as light source modules emit brighter light, a larger amount of heat is generated. If the heat is not dissipated, the lifespan of the lighting devices is shortened.

SUMMARY

Embodiments provide a light source module, a fabrication method therefor, and a lighting device, which can achieve rapid fabrication processes by eliminating the need for a separate PCB, and inexpensive fabrication cost by solving the above-described problems.

Embodiments also provide a light source module, a fabrication method therefor, and a lighting device, which can solve the problem of heat dissipation while realizing high luminance.

Embodiments also provide a light source module, a fabrication method therefor, and a lighting device, which can solve the problem of product yield, that may occur due to a short circuit, disconnection, component part separation, etc.

Embodiments also provide a light source module, a fabrication method therefor, and a lighting device, which can be implemented suitable for mass production.

In one embodiment, a light source module includes: at least one light source emitting light; and a heat sink absorbing heat from the light source and dissipating the heat to the outside; a mounting part provided in a quadrangular structure at an upper portion of the heat sink such that the light source is mounted thereon; a heat dissipation fin provided under the heat sink to absorb heat generated from the mounting part and dissipate the heat to the outside; an insulating layer having electrical insulating properties, the insulating layer being provided on at least one surface of the heat sink; an electrically conductive layer provided in the insulating layer, the electrically conductive layer providing a path through which electric current is applied to the light source; and a lens cover provided over the light source. Accordingly, only the electrically conductive layer is provided, so that it is possible to perform a rapid fabrication process and to reduce cost of precious metal, which is economically advantageous.

The light source module may include: at least two conductive unit bodies provided by spacing the electrically conductive layer apart from each other; and an electrical closed circuit provided on the mounting part as the conductive unit bodies and the light source are connected to each other. Accordingly, the conductive unit body is structuralized, thereby providing a stable electrical connection structure.

The light source may include: a light source main body; and two electrode pads provided on the bottom of the light source main body to be connected to the electrically conductive layer. Accordingly, it is possible to improve the reliability of electrical connection between the light source and the conductive layer.

The light source module may include: a mounting groove provided in the shape of a closed curve at both the inside and the outside of the electrically conductive layer in the mounting part; a rib provided at a lower portion of the lens cover to correspond to the mounting groove; and a sealer inserted into an interface between the mounting groove and the rib. Accordingly, it is possible to improve the waterproofness of an area in which electric current flows.

According to the present disclosure, the conductive layer includes an electrically conductive layer applying electric current to the light source and a heat dissipation conductive layer diffusing heat, so that heat dissipation performance can be enhanced even when the insulating layer is provided.

According to the present disclosure, all heat dissipation conductive layers are provided as a single body, so that the diffusion of heat can be more effectively performed.

According to the present disclosure, a neck part is provided at a portion at which the conductive layer and the light source are connected to each other, so that it is possible to prevent a product defect caused by bonding of the light source. Also, it is possible to improve the yield of products in mass production.

According to the present disclosure, islands integrally formed with the insulating layer are provided in an internal region of the conductive layer, so that it is possible to prevent separation between the conductive layer and the insulating layer due to the use of products. Also, it is possible to improve the reliability of products.

According to the present disclosure, an insulating layer made of a resin material is thinly applied on at least one surface of the heat sink, a metal joint face is provided at the insulating layer, and at least two conductive layers spaced apart from each other are provided on the metal joint face, thereby performing a rapid fabrication process. Also, it is possible to prevent insufficient heat diffusion.

That is, according to the present disclosure, it is possible to obtain effects such as rapid fabrication processes, inexpensive fabrication cost, facilitation of mass production, improvement of product yield, and promotion of heat dissipation. Furthermore, it is possible to obtain various effects that can be understood through configurations described in the embodiments.

The details of one or more embodiments are set forth in the accompanying drawings and the description below. Other features will be apparent from the description and drawings, and from the claims.

DETAILED DESCRIPTION OF THE EMBODIMENTS

Hereinafter, exemplary embodiments will be described in detail with reference to the accompanying drawings. The technical objective of embodiments is not limited to the aforementioned technical problem, and technical problems not mentioned above can be clearly understood by a person skilled in the art by the disclosure below.

Figure 1:
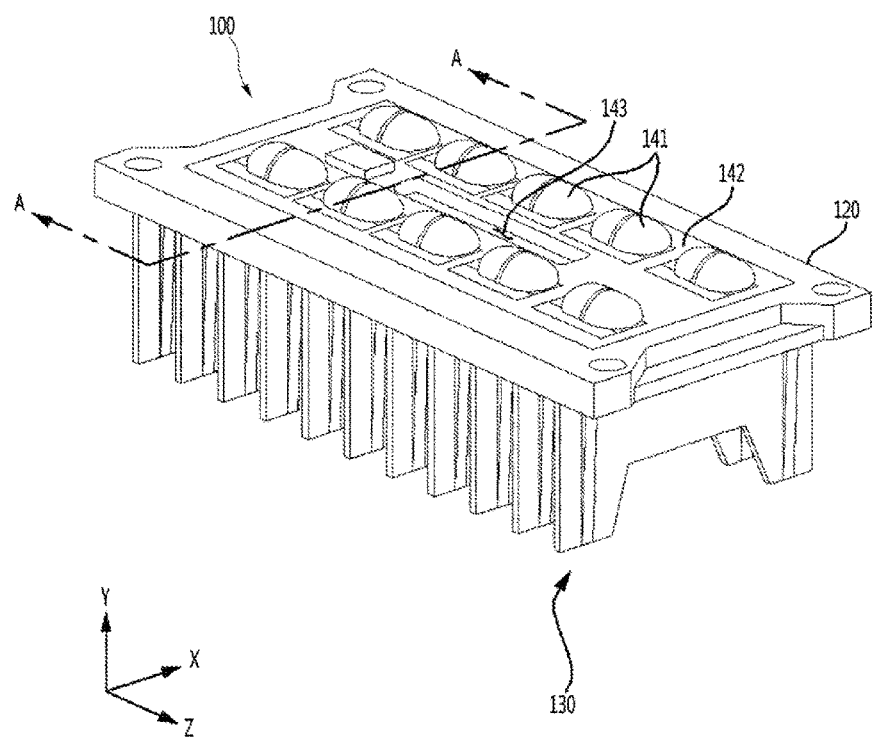
FIG. 1 is a perspective view of a light source module according to an embodiment.
Figure 2:
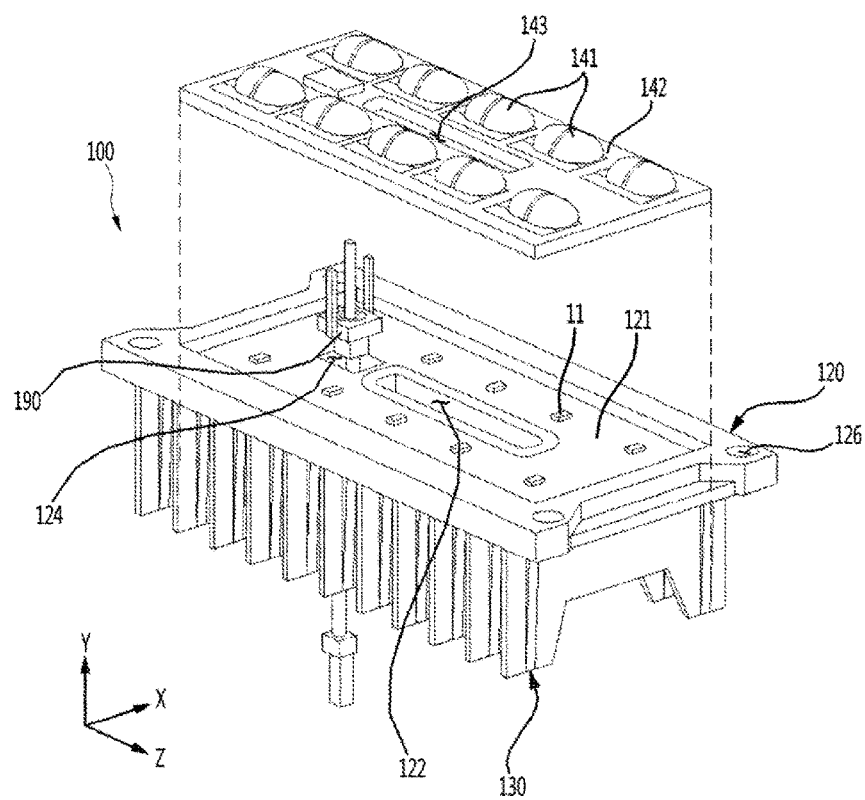
FIG. 2 is an exploded perspective view of the light source module.

FIG. 1 is a perspective view of a light source module according to an embodiment. FIG. 2 is an exploded perspective view of the light source module.

Referring to FIGS. 1 and 2, the light source module 100 according to the embodiment may include at least one light source 11 generating light and a body supporting the light source 11.

The light source 11 may include all means that generate light by being supplied with electric energy. For example, the light source 11 may include a light source in the form of a point light source. Specifically, the light source 11 may include any one of a light emitting diode and a laser diode. In the light source 11, a plurality of point light sources emitting light of different colors may be disposed adjacent to each other such that the colors are mixed with each other, thereby emitting light of white or another color.

The body is provided as a part that allows the light source 11 to perform a physical electrical action, so that the light source 11 can be stably operated. The body enables heat generated by the light source 11 to be effectively dissipated. The body is electrically connected to the light source 11 to supply power to the light source 11.

The body may include a heat sink 120. The light source 11 may be fastened to the heat sink 120 through the medium of another member, or may be directly fastened to the heat sink 120. Preferably, the light source 11 may be fastened to the heat sink 120 for the purpose of physical coupling such as support of the weight thereof. However, in order to insulate between the light source 11 and the heat sink 120, the light source 11 may be fastened to the heat sink 120 with a predetermined insulating layer interposed therebetween.

A mounting part 121 on which the light source 11 is mounted may be provided on one surface of the heat sink 120. The mounting part 121 allows heat generated by the light source 11 to be rapidly absorbed into the heat sink 120. When a heat dissipation fin 130 is connected to the other surface of the heat sink 120, the heat sink 120 may transfer, to the heat dissipation fin 130, heat generated by the light source 11 and heat generated by light emitted from the light source 11. It will be apparent that the heat dissipation fin 130 may rapidly dissipate heat to the outside. Also, the heat sink 120 may rapidly dissipate heat to the outside.

The heat sink 120 may be formed of a metal or resin material having excellent heat radiation and heat transfer efficiencies, but the present disclosure is not limited thereto. As an example, the heat sink 120 may be an alloy made of one or two or more selected from the group consisting of aluminum (Al), gold (Au), silver (Ag), copper (Cu), nickel (Ni), tin (Sn), zinc (Zn), tungsten (W), and iron (Fe). As another example, the heat sink 120 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic. The heat sink 120 may be formed through injection molding, etching, etc., but the present disclosure is not limited thereto.

The heat sink 120 has a plate shape, and may be provided with a quadrangular planar shape. Specifically, the mounting part 121 may be formed by depressing one surface (e.g., an upper surface) of the heat sink 120. A lens cover 142 may be mounted on the mounting part 121. The mounting part 121 may be provided with a waterproof structure with the outside by the lens cover 142. The light source 11 can be waterproofed against the external environment by coupling between the mounting part 121 and the lens cover 142.

A fastening hole 126 may be formed at an edge of the heat sink 120. When the light source module 100 is coupled to a lighting device, a fastening member passes through the fastening hole 126.

The body may include the heat dissipation fin 130 for improving the heat dissipation efficiency of the heat sink 120. The heat dissipation fin 130 may have a shape in which the area of the heat dissipation fin 130 contacted with air is maximized. The heat dissipation fin 130 is transferred with heat of the heat sink 120 to be heat-exchanged with external air. Specifically, the heat dissipation fin 130 may be provided in the shape of a plurality of plates further extending downward from the other surface (bottom surface) of the heat sink 120. More specifically, the heat dissipation fin 130 may be disposed in plurality with a predetermined pitch. In addition, the width of the heat dissipation fin 130 may be formed in a region equal or similar to the width of the heat sink 120 such that the heat dissipation fin 130 can be effectively transferred with heat of the heat sink 120. The heat dissipation fin 130 may be formed with the heat sink 120 as a single body, or may be fabricated as a separate component part. The heat dissipation fin 130 may include a material having excellent heat transfer efficiency, e.g., at least one selected from the group consisting of aluminum (Al), nickel (Ni), copper (Cu), silver (Ag), and tin (Sn). Preferably, the heat dissipation fin 130 may be integrally formed with the heat sink 120 using the same material.

Figure 3:
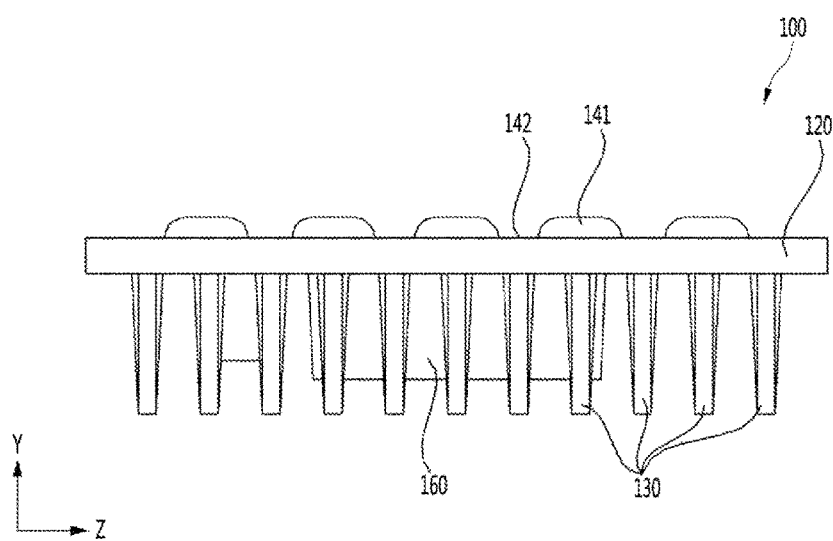
FIG. 3 is a front view of the light source module.
Figure 4:
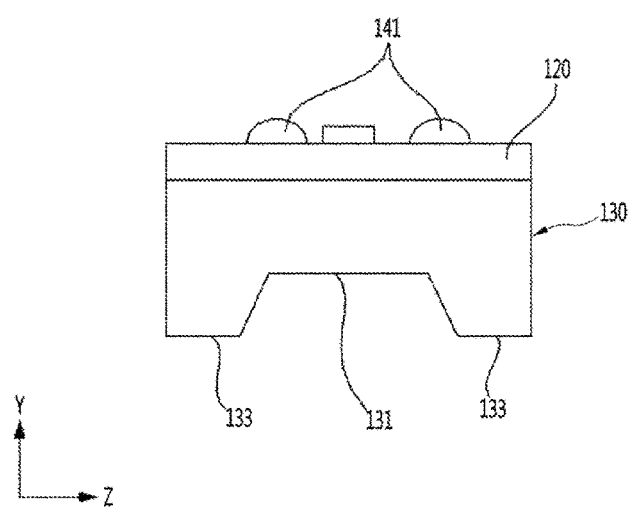
FIG. 4 is a side view of the light source module.

FIG. 3 is a front view of the light source module. FIG. 4 is a side view of the light source module.

Referring to FIGS. 3 and 4, the heat dissipation fin 130 may be disposed long in the width direction (the direction of a short edge) of the heat sink 120. Also, the heat dissipation fin 130 may be disposed in plurality with a predetermined pitch in the length direction (the direction of a long edge) of the heat sink 120. A central portion 131 of the heat dissipation fin 130 may be further depressed toward the heat sink 120 than both end portions 133 of the heat dissipation fin 130. The light sources 11 may be positioned to respectively overlap both the end portions 133 in the vertical direction. Both the end portions 133 of the heat dissipation fin 130 may be formed higher than the central portion 131 of the heat dissipation fin 130. Accordingly, a portion to which heat of a high temperature is transferred among several portion of the heat dissipation fin 130 can be contacted with a larger amount of air, thereby improving heat dissipation efficiency. Further, the central portion 131 of the heat dissipation fin 130 enables fabrication cost to be saved.

An air hole 122 (see FIG. 2) may be formed in the heat sink 120. The air hole 122 may be formed to vertically pass through the heat sink 120. Specifically, the air hole 122 may be formed to pass through the heat sink 120 toward the head dissipation fin 130 from the mounting part 121. According to the above-described configuration, a space in which air flows can be provided. The air hole 122 may be formed long in the length direction of the heat sink 120 at a central portion of the heat sink 120. The air hole 122 may communicate with a cover hole 143 (see FIGS. 1 and 2) formed in the lens cover 142 while overlapping the cover hole 143 in the vertical direction.

The light sources 11 may be positioned at the periphery of the air hole 122. Specifically, the light sources 11 may be disposed adjacent to the air hole 122 on the one surface of the heat sink 120, which forms the periphery of the air hole 122. Therefore, the air hole 122 may be first heated by heat generated by the light sources 11. The air hole 122 may allow air to be circulated by a temperature difference between the inside and outside of the air hole 122. The circulated air may accelerate cooling of the heat dissipation fin 130 and the heat sink 120. Specifically, the air hole 122 may be positioned to vertically overlap the central portion 131 of the heat dissipation fin 130. The light sources 11 may be positioned to respectively overlap both the end portions of the heat dissipation fin 130.

Figure 5:
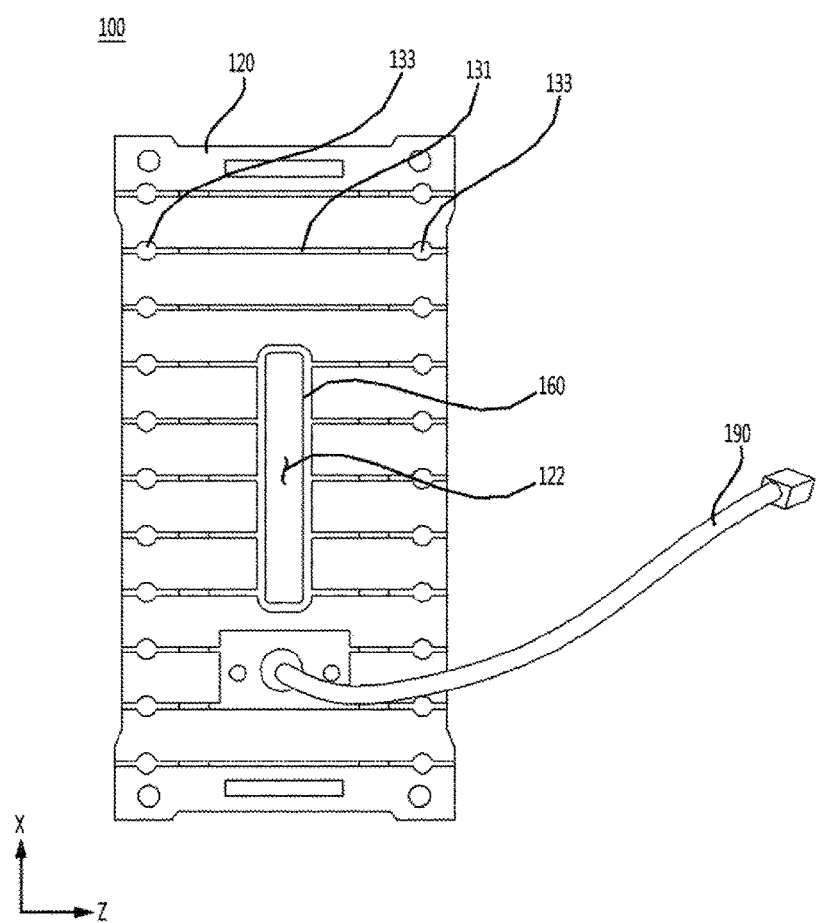
FIG. 5 is a bottom view of the light source module.

FIG. 5 is a bottom view of the light source module.

Referring to FIG. 5, the light source module 100 may further include an air guiding part 160 extending downward of the heat sink 120 from the circumference of the air hole 122, the air guiding part 160 communicating with the air hole 122 to guide air. The air guiding part 160 may be formed in the shape of a cylinder having a space therein. That is, the circumference of the air guiding part 160 may be configured to overlap the circumference of the air hole 122. In other words, the air guiding part 160 may be formed in the shape of a chimney surrounding the air hole 122. The section of the air guiding part 160 may be formed in the shape of an approximately rectangle. In addition, each corner of the rectangle may be curved.

The air guiding part 160 may be made of a material having excellent heat transfer efficiency. For example, the air guiding part 160 may include at least one selected from the group consisting of aluminum (Al), nickel (Ni), copper (Cu), silver (Ag), and tin (Sn). Also, the air guiding part 160 may be formed of at least one selected from the group consisting of a resin material such as polyphthalamide (PPA), silicon (Si), aluminum nitride (AlN), photo sensitive glass (PSG), polyamide9T (PA9T), syndiotactic polystyrene (SPS), a metal material, sapphire ($Al_2O_3$), beryllium oxide (BeO), and ceramic. The air guiding part 160 may be integrally formed with the heat sink 120 and the heat dissipation fin 130 through the same process using the same material.

The outer surface of the air guiding part 160 may be connected to at least portions of a plurality of heat dissipation fins 130. Also, the outer surface of the air guiding part 160 may transfer, to the air guiding part 160, heat transferred from the light source 11 to the heat sink 120 and the heat dissipation fin 130. The air guiding part 160 may further accelerate the air flowing into the air hole 122. In addition, a connector hole (see 124 of FIG. 2) through which a connector 190 supplying power to the light source 11 passes may be formed in the heat sink 120.

Figure 6:
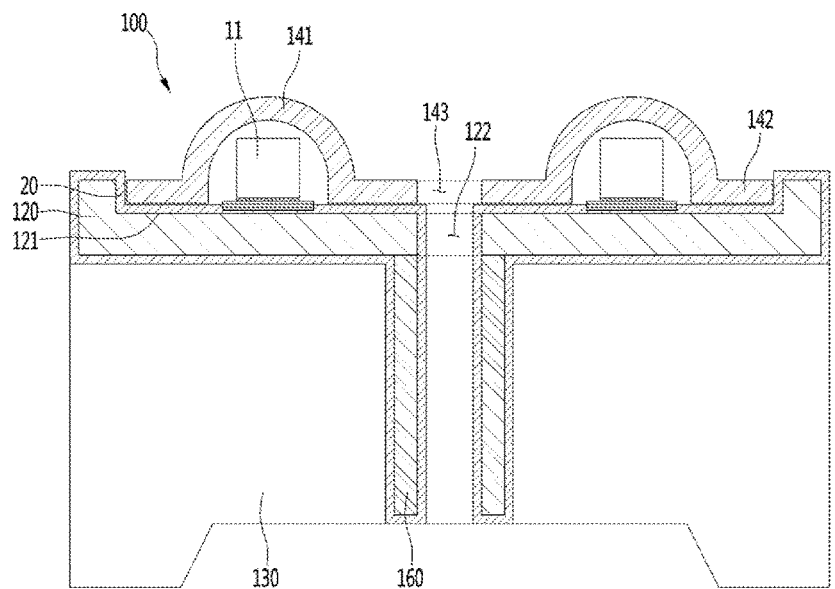
FIG. 6 is a sectional view taken along line A-A' of FIG. 1.

FIG. 6 is a sectional view taken along line A-A' of FIG. 1. FIG. 6 is a sectional view taken along a portion at which the light sources 11 are placed, specifically, a portion at which power is applied to the light sources 11.

Referring to FIG. 6, an electrically insulating layer 20 may be formed on a surface of the heat sink 120. The insulating layer 20 may be formed on the entire surface of the heat sink 120. However, the present disclosure is not limited thereto, and the insulating layer 20 may be formed on only a portion of the entire surface. When the heat dissipation fin 130 and the air guiding part 160 is formed with the heat sink 120 as a single body, the insulating layer 20 may also be formed on surfaces of the heat dissipation fin 130 and the air guiding part 160. In this case, the insulating layer 20 may be formed on the entire surface of each component part, and may be formed on only a portion of the entire surface.

According to an embodiment, the heat sink 120, the heat dissipation fin 130, and the air guiding part 160 may be provided together by a die-casting technique, and the insulating layer 20 may be then provided.

The insulating layer 20 may be applied by a powder coating technique. The powder coating technique may be any one of an electrostatic spray technique, an electrostatic brush technique, and a fluidized bed technique. Therefore, the insulating layer 20 may be referred to as a coated insulating layer or applied insulating layer. Accordingly, a process can be rapidly and inexpensively performed, and the yield of products can be improved. According to this technique, the insulating layer 20 may be provided as a thin film. Thus, the efficiency of heat dissipated to the heat sink 120 can be improved.

The insulating layer 20 may insulate between the heat sink 120 and a conductive layer 40 which will be described later. The conductive layer 40 has electrical conductivity and hence may be electrically connected to the light source 11. The conductive layer 40 may be a path through which electric current is applied to the light source 11. Also, the conductive layer 40 may have a function of rapidly diffusing heat. To this end, the conductive layer 40 may be made of a metal material. For example, the conductive layer 40 may be stacked in a single layer or in multiple layers, including at least one selected from the group consisting of Ag, Au, Cu, and Ni. Here, the oxidation of the Ag and Au can be prevented even when the Ag and Au are exposed to the outside, and hence the conductive layer 40 may be used as the outermost layer. This is equally applied to embodiments.

The light source 11 may be provided as a vertical light emitting diode including two electrodes formed downwardly. In FIG. 6, it is illustrated that one electrode is connected to the light source 11, and it can be easily expected that the other electrode will be provided under or above the ground. If the vertical light emitting diode is mounted on the conductive layer 40, separate wire bonding is not required.

The conductive layer 40 may be provided in a depression part 21 previously formed at a position at which the conductive layer 40 is to be provided. The depression part 21 may be formed by etching the insulating layer 20 through laser direct structuring (LDS). The depression part 21 may be formed into a structure in which at least the bottom surface in its internal region has a rough surface including a metal core. The depression parts 21 may be provided to be spaced apart from each other with respect to the conductive layers 40 connected to the light source 11. In other words, a pair of conductive layers 40 to provide a pair of electrodes may be placed inside different depression parts 12, to prevent a short circuit between the electrodes connected to the light source 11.

The conductive layer 40 may be provided in the depression part 21 to thereby form circuit patterns interconnecting the light sources 11 to the connector hole 124. The conductive layer 40 may be formed by repeatedly performing a plating process at least twice. According to an embodiment, in the conductive layer 40, Cu, Ni, and Au may be sequentially stacked to respectively provide a first plating layer 41, a second plating layer 42, and a third plating layer 43, which will be described later. With this configuration, heat generated by the light sources 11 transfers easily through the conductive layer 40 and the recess part 21 of the insulating layer 20 to reach the heat sink 120.

The method of providing the insulating layer 20, the depression part 21, and the conductive layer 40 may be performed by forming a conductive film on the insulating layer through techniques such as sputtering and electrolytic/electroless plating using a conductive material such as copper and then etching the conductive film. In this case, the depression part 21 may be previously provided in the insulating layer 20 so as to prevent a short circuit, etc. However, the present disclosure is not limited thereto, and the LDS may be performed. This is because fabrication cost is inexpensive, a process can be rapidly and precisely performed, and mass production can be achieved using laser equipment.

The light source module 100 may further include a plurality of lenses 141 that shield the light sources 11 and refract light generated by the light sources 11. The lens 141 may diffuse light generated by the light source 11. The lens 141 may determine the diffusion angle of light generated by the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be provided to the lens cover 142 formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be inserted and mounted into the mounting part 121 to waterproof the light source 11 from the outside.

The cover hole 143 communicating with the air hole 122 may be formed in the lens cover 142. Specifically, the cover hole 143 may be formed to vertically pass through the lens cover 142 at the center of the lens cover 142.

The insulating layer 20 may include a material capable of efficiently reflecting light. In this case, light emitted from the light source 11 and light reflected from the lens cover 142 including the lens 141 are again reflected to the outside, thereby further improving the use efficiency of light. Further, light lost as heat is reduced, thereby achieving high cooling efficiency.

Hereinafter, a method of providing the insulating layer, the depression part, and the conductive layer, which is included in embodiments, will be described in detail.

Figure 7:
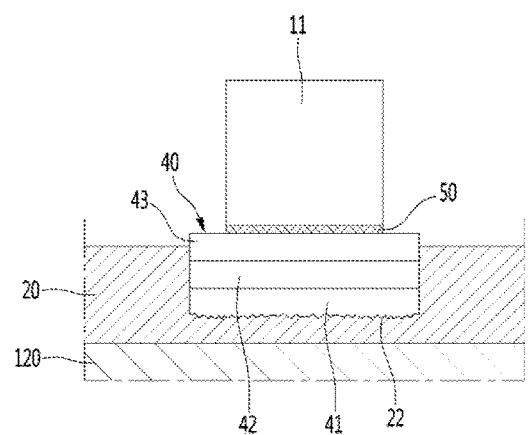
FIG. 7 is an enlarged view of a portion at which a light source is placed in FIG. 6.

FIG. 7 is an enlarged view of a portion at which the light source is placed in FIG. 6.

Referring to FIG. 7, a metal joint face 22 may be processed in an inner surface of the depression part 21. The metal joint face 22 may refer to a surface of the insulating layer 20 that is processed as a surface having an appropriate property in which the conductive layer 40 is stacked thereon.

The metal joint face 22 may be formed by irradiating laser onto a region of the insulating layer 20 in which the conductive layer 40 is to be provided.

The metal joint face 22 may be provided with a metal core with which a metal of the conductive layer 40 can be joined. The surface of the metal joint face 22 may be processed as a lattice-shaped trench. The metal joint face 22 may include at least the bottom surface of the depression part 21. The trench may be irregularly provided. The metal core is provided to the insulating layer 20, so that it is possible to promote heat transfer through the insulating layer 20.

The conductive layer 40 may be stacked on the metal joint face 22. At least one plating layer may be stacked in the conductive layer 40. For example, the conductive layer 40 may include the first plating layer 41 made of copper, the second plating layer 42 made of nickel, and the third plating layer 43 made of gold or silver. The first plating layer 41 may be stacked to a thickness of 10 to 20 μm. The second plating layer 42 may be stacked to a thickness of 5 to 15 μm. The third plating layer 43 may be stacked to a thickness of 0.1 μm or so. The third plating layer 43 may cause an increase in material cost. Therefore, the third plating layer 43 may not be stacked. However, the third plating layer 43 may be provided as a thin film for anti-oxidation and protection.

The first plating layer 41 placed at the lowermost side of the conductive layer 40 serves as an electroconductive functional layer that can reduce the amount of heat generation by reducing electrical resistance. To this end, the first plating layer 41 may be made of copper. In order to ensure sufficient electrical conductivity, the first plating layer 41 may be formed thickest among the plating layers. The first plating layer 41 may be made of a metal having a high electrical conductivity as well as the copper.

The second plating layer 42 placed in the middle of the conductive layer 40 serves as a soldering functional layer that improves the quality of soldering. In order to perform soldering, it is necessary for a melted solder to be well wettable on the entire surface of a base material and to be well spread on the surface of the base material. The second plating layer 42 may be made of nickel as a metal for ensuring characteristics of the soldering.

The third conductive layer 43 placed at the uppermost side of the conductive layer 40 serves as a protective functional layer for protecting the plating layers 41 and 42 thereinside. The third plating layer 43 may be made of gold that is not oxidized or discolored. In the case of silver, the silver may produce a discolored LED package. Also, the silver may penetrate into an LED package and chemically react with internal component parts of a light emitting part, thereby degrading light emitting efficiency. Since the third plating layer 43 performs a function of protection, the third plating layer 43 may be provided as the thinnest layer. The second plating layer 42 may be not provided, and only the third plating layer 43 may be provided, but this is not preferable in terms of cost. Since the third plating layer 43 is provided as a considerably thin layer, the third plating layer 43 does not interfere with the function of the second plating layer 42 in the soldering.

The third plating layer 43 may be provided as resin. In this case, the resin may be stacked through another technique instead of a plating technique. The resin is not covered at a portion on which the soldering is performed, so that the soldering cannot be interfered with by the resin.

A bonding layer 50 may be provided on the conductive layer 40. The light source 11 may be placed on the bonding layer 50. The bonding layer 50 may include a low-temperature solder paste with which soldering can be performed at a low temperature. For example, the bonding layer 50 may include OM525. The bonding layer 50 may be provided by allowing the low-temperature solder paste to pass through a reflow machine in a state in which a light emitting device is mounted on the low-temperature solder paste. The soldering is performed at the low temperature, so that it is possible to prevent separation between two of the heat sink 120, the insulating layer 20, and the conductive layer 40. Accordingly, it is possible to improve the reliability and yield of products can be improved and to prevent the deterioration of a material, caused by long-term use.

FIGS. 8 to 12 are views sequentially illustrating a fabrication method of the light source module.

Figure 8:
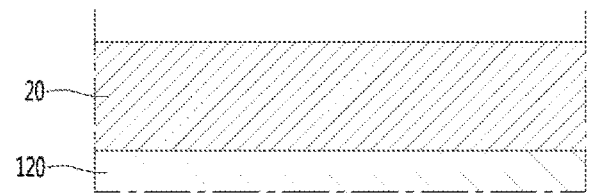
FIGS. 8 to 12 are views sequentially illustrating a fabrication method of the light source module.

Referring to FIG. 8, the insulating layer 20 may be provided to a body fabricated by, for example, a die-casting technique. The insulating layer 20 may be applied by a powder coating technique. The insulating layer 20 may be molded using a material including resin and then provided as a resin molded article. More specifically, the powder coating technique may be any one of an electrostatic spray technique, an electrostatic brush technique, and a fluidized bed technique. Therefore, the insulating layer 20 may be referred to as a coated insulating layer or applied insulating layer. The thickness of the coated insulating layer may be 60 to 80 μm. However, the thickness is not limited thereto, and may be selected to have various dimensions according to insulation performance, heat dissipation performance, and process variables. In an embodiment, a condition may be found in which, when the light source 11 is a light emitting diode, is connected to a commercial power source, and is used suitable for external environment, the insulation and heat dissipation of the insulating layer 20 can be ensured, and the providing of the insulating layer 20 can be performed through an inexpensive process.

The LDS may be applied to the insulating layer 20 such that the conductive layer 40 is stacked on at least one portion of the surface of the insulating layer 20. The LDS is a process performed before a plating process, and may be performed by irradiating laser onto a region in which the conductive layer 40 is to be plated on the surface of the insulating layer 20. A plating target region on the surface of the resin molded article is reformed by the laser, to have a property suitable for plating. To this end, the insulating layer 20 may contain a 'core generating agent for LDS' (hereinafter, simply referred to as a 'core generating agent') capable of forming a metal core by means of laser, or may have a predetermined pattern formed therein such that a plating layer is provided at the inner surface of the depression part 21.

First, a case where the insulating layer 20 contains a core generating agent will be described.

A core generating agent may be contained in the resin molded article forming the insulating layer 20. If laser is irradiated onto the core generating agent, a metal core may be generated as the core generating agent is decomposed. In addition, a plating target region onto which the laser is irradiated may have a surface roughness. The plating target region reformed by the laser can be suitable for plating due to the metal core and the surface roughness. The metal core may mean a core with which a metal is joined in a subsequent plating process.

The core generating agent may include a metal oxide having a spinel, a heavy metal composite oxide spinel such as copper chromium oxide spinel, a copper salt such as copper hydroxide phosphate, copper phosphate, copper sulfate, or cuprous thiocyanate, and the like. A polyester-based resin may be used as a material of the insulating layer 20. This is because the polyester-based resin can obtain better adhesion with a metal. Thus, it is possible to prevent separation between two of the heat sink 120, the insulating layer 20, and the conductive layer 40, which may be caused by heat applied in a bonding process of the light source 11 as a subsequent process.

Next, a case where a predetermined pattern is formed in the inner surface of the depression part 21. Although the resin molded article forming the insulating layer 20 does not contain the core generating agent, the conductive layer 40 may be formed by forming a trench line in a predetermined pattern, e.g., a lattice pattern in the plating target region. The trench line may effectively promote the joining of a metal with the plating target region on the surface of the resin molded article, and may allow the plating process to be performed. The trench line may be provided with at least two kinds of trenches intersecting each other.

The forming of the trench line in the predetermined pattern may be performed by irradiating laser onto the plating target region on the surface of the insulating layer 20.

Figure 9:
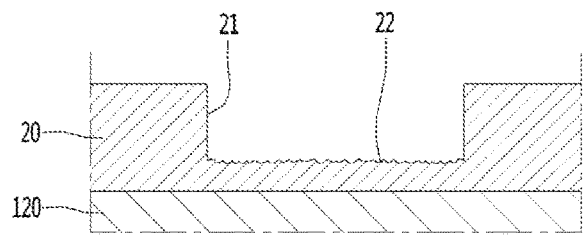

FIG. 9 is a view illustrating that the depression part is provided in the insulating layer.

Referring to FIG. 9, as described above, laser may be used as a means for providing the depression part 21 in the insulating layer 20. In this case, a medium providing the laser may include, for example, yttrium aluminum garnet (YAG), yttrium orthovanadate (YVO4), ytterbium (YB), $CO_2$, etc. The wavelength of the laser may be, for example, 532 nm, 1064 nm, 1090 nm, 9.3 μm, 10.6 μm, etc. An algorithm in which processing is performed by recognizing a three-dimensional shape may be used while processing is performed using the laser. For example, a method may be applied in which the processing height of the laser is controlled by recognizing the body including at least the heat sink 120 as a three-dimensional recognition program and separating the body into several levels on the basis of the height of the body. The laser may have, for example, an output value of about 2 W to about 30 W.

As described above, the metal joint face 22 processed by the laser has at least one of a metal core, a rough surface, and a trench, so that the conductive layer 40 can be plated in a subsequent process.

Figure 10:
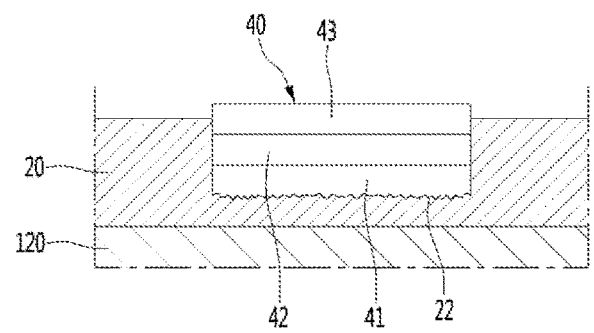

FIG. 10 is a view illustrating that the conductive layer is provided in the depression part.

Referring to FIG. 10, the conductive layer 40 may be provided by plating a metal on the metal joint face 22 using an electroless process. It will be apparent that another plating process may be performed. The conductive layer 40 may be copper, nickel, gold, silver, or a combination thereof. The conductive layer 40 may be a single-layered or stacked structure. In the stacked structure, layers may be the same metal or different metals. In an embodiment, copper, nickel, and gold may be sequentially stacked.

As an embodiment, a case where the first plating layer 41 made of copper is provided will be described in detail.

The heat sink 120 providing the metal joint face 22 is immersed in an electroless copper plating solution. In this case, the heat dissipation fin 130 and the air guiding part 160 may be immersed together with the heat sink 120. For example, an aqueous plating solution for electroless copper may contain about 55 ml to about 65 ml of a copper dry bathing/supplementing agent, about 55 ml to about 65 ml of an alkaline supplementing agent, about 15 ml to about 20 ml of a complexing agent, about 0.1 ml to about 0.2 ml of a stabilizing agent, and about 8 ml to about 10 ml of formaldehyde, based on deionized water.

The copper dry bathing/supplementing agent may contain, for example, about 6 parts by weight to about 12 parts by weight of copper sulfate, about 1 part by weight to about 1.5 parts by weight of polyethylene glycol, about 0.01 part by weight to about 0.02 part of weight of the stabilizing agent, and about 78 parts by weight to about 80 parts by weight of water.

The alkaline supplementing agent may contain, for example, about 40 parts by weight to about 50 parts by weight of sodium hydroxide, about 0.01 part by weight to about 0.02 part by weight of the stabilizing agent, and about 50 parts by weight to about 60 parts by weight of the water.

The complexing agent may contain, for example, about 49 parts by weight to about 50 parts by weight of the sodium hydroxide, about 0.01 part by weight to about 0.02 part by weight of the stabilizing agent, and about 50 parts by weight to about 51 parts by weight of the water.

The stabilizing agent may contain, for example, about 0.2 part by weight to about 0.3 part by weight of potassium selenocyanate, about 5 parts by weight to about 6 parts by weight of potassium cyanide, about 0.3 part by weight to about 0.4 part by weight of the sodium hydroxide, and about 92 parts by weight to about 93 parts by weight of the water.

For example, in order to provide the first plating layer 41 made of copper, a resin molded article provided with a catalyst may be immersed at a deposition speed of about 0.5 to about 0.7 m/10 min in the electroless copper solution at about 41° C. to about 55° C. and then washed by water.

After that, a plating process may be further performed by repeatedly providing another plating layer in a plating solution.

The conductive layer 40 may be stacked up to a range exceeding the depth of the depression part 21. Accordingly, the resistance of the conductive layer 40 can be reduced by increasing the area of the conductive layer 40 to which electric current is applied, and thus the amount of heat generated by the resistance can be reduce. It will be apparent that the present disclosure is not limited to the above-described configuration.

Figure 11:
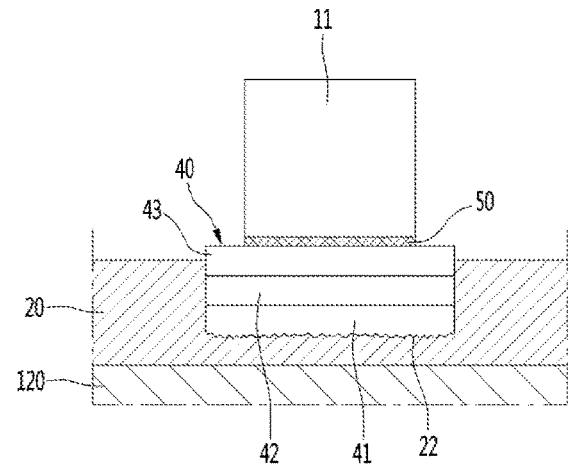

FIG. 11 is a view illustrating that the bonding layer is provided.

Referring to FIG. 11, the bonding layer 50 may be provided by applying a low-temperature solder paste on the conductive layer 40, mounting the light source 11 at a position at which the electrodes of the light source 11 are aligned on the low-temperature solder paste, and then allowing the low-temperature solder paste to pass through a reflow machine. In the reflow process, an unnecessary portion is removed from the low-temperature solder paste, and a conductive element remains, so that the conductive layer 40 and the light source 11 can be electrically connected to each other.

The low-temperature solder paste may include OM525 available at about 160° C. Since a relatively low temperature atmosphere is formed in the reflow process, it is possible to prevent separation between the insulating layer 20 and the heat sink 120 and separation between the conductive layer 40 and the insulating layer 20. Accordingly, it is possible to improve the yield and reliability of products.

Figure 12:
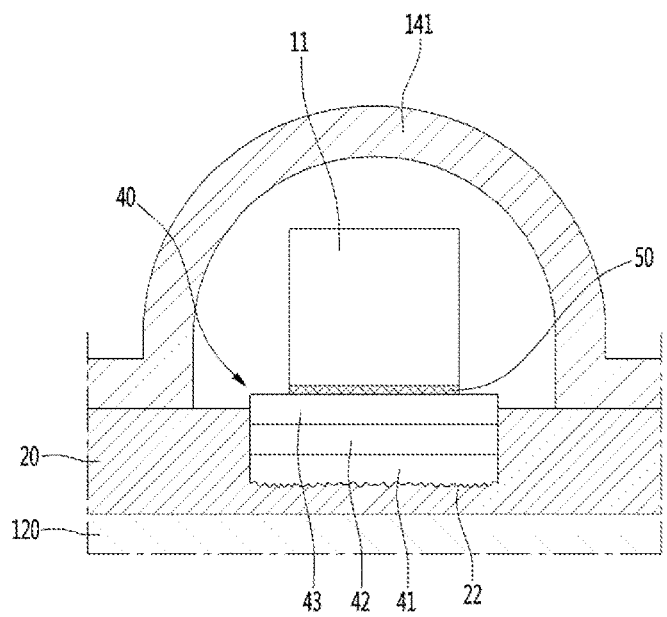

FIG. 12 is a view illustrating that the lens is further provided over the light source.

The lens 141 is provided over the light source 11. The lens 141 shields the light source 11, and may refract and diffuse light generated by the light source 11. The lens 141 may determine the diffusion angle of light generated by the light source 11 according to its shape. For example, the lens 141 may be molded in a concave shape around the light source 11. Specifically, the lens 141 may include a material allowing light to be transmitted therethrough. For example, the lens 141 may be formed of transparent silicon, epoxy, or another resin material. In addition, the lens 141 may surround the light source to protect the light source 11 from external moisture and impact and to isolate the light source 11 from the outside.

More specifically, for convenience of assembly, the lens 141 may be provided to the lens cover 142 formed corresponding to the insulating layer 20. The lens cover 142 may be formed to correspond to the insulating layer 20 on the top surface of the insulating layer 20. The lens 141 positioned at the lens cover 142 may be disposed at a position overlapping the light source 11. The lens cover 142 may be mounted inside the mounting part 121 to waterproof the light source 11 from the outside.

Figure 13:
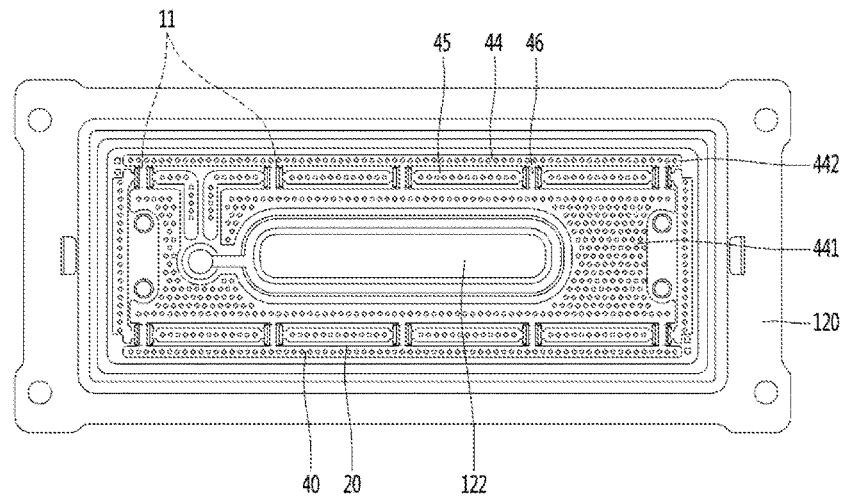
FIG. 13 is a plan view of the light source module.

FIG. 13 is a plan view of the light source module. In FIG. 13, it is illustrated that the lens cover 142 is omitted, and a planar structure of a conductive layer, which is not shown in other drawings, will be described in detail.

Referring to FIG. 13, as described above, the conductive layer 40 may be provided in the light source module 100 according to the embodiment. It is as described above that the conductive layer 40 serves as a path through which electric current is applied to the light source 11. The conductive layer 40 may further perform a function of diffusing heat such that the effect of heat dissipation can be enhanced. According to the present disclosure, the heat dissipation efficiency of the light source module can be further improved, and there is no problem in heat dissipation performance even when the insulating layer 20 is formed thick.

More specifically, the conductive layer 40 may include an electrically conductive layer 45 that enables electric current to flow along a path through which the light source 11 is connected to the conductive layer 40, and a heat dissipation conductive layer 44 that enables heat to be rapidly diffused along the surface of the heat sink 120, thereby enhancing the effect of heat dissipation.

The electrically conductive layer 45 may provide a path through which electric current applied from the outside can flow. A conductive unit body 49 (see FIG. 14) capable of connecting the light sources 11 to each other may function to connect between the light sources 11. The conductive unit body 49 may perform an action as one unit body connecting the connector and the light source to each other. In addition, the conductive unit body 49 may be provided to have a predetermined thickness and a predetermined width, where it can provide a path through which electric current flows.

The heat dissipation conductive layer 44 does not provide a path through which electric current flows, but may perform a function of rapidly diffusing heat generated by the light source 11 along the surface of the heat sink 120. The insulating layer 20 is provided as a resin molded article, and may have an insulating property. For electric heat as well as electric current, the conductivity of the insulating layer 20 may be lower than that of metal. Even in this case, heat can be diffused along the heat dissipation conductive layer 44 so as to rapidly dissipate the heat. The heat dissipation conductive layer 44 can obtain the same effect not only in heat diffusion but also in heat dissipation.

The heat dissipation conductive layer 44 may include an external heat dissipation conductive layer 442 placed at the outside of the electrically conductive layer 45 and an internal heat dissipation conductive layer 441 placed at the inside of the electrically conductive layer 45. The internal heat dissipation conductive layer 441 and the external heat dissipation conductive layer 442 may be connected to each other through a bridge 46 so as to further enhance the heat diffusion and the heat dissipation. The external heat dissipation conductive layers 442 may be provided as a single structure in which they are connected to each other. The internal heat dissipation conductive layers 441 may be provided as a single structure in which they are connected to each other. Accordingly, heat diffusion can be accelerated. The external heat dissipation conductive layer 442 and the internal heat dissipation conductive layer 441 may be connected as a single body by the bridge 46. Therefore, unlike the electrically conductive layer 45, all heat dissipation conductive layers 44 may be connected to each other as one structure. Accordingly, the diffusion of heat generated by the light source 11 can be further accelerated. In other words, the diffusion of heat can be accelerated from any hot position, e.g., an adjacent position of the light source 11 to any cold position, e.g., an adjacent position of the air hole 122. It can be easily expected that, if the heat diffusion is accelerated, the effect of heat dissipation will be enhanced corresponding to the acceleration of the heat diffusion.

The heat dissipation conductive layer 44 may be substantially provided on an almost entire surface of the heat sink 120, except a distance between the heat dissipation conductive layer 44 and the electrically conductive layer. Accordingly, it is possible to prevent degradation of heat absorption and heat dissipation effects of the heat sink 120, which caused by the insulating layer 20 made of a resin material.

Figure 14:
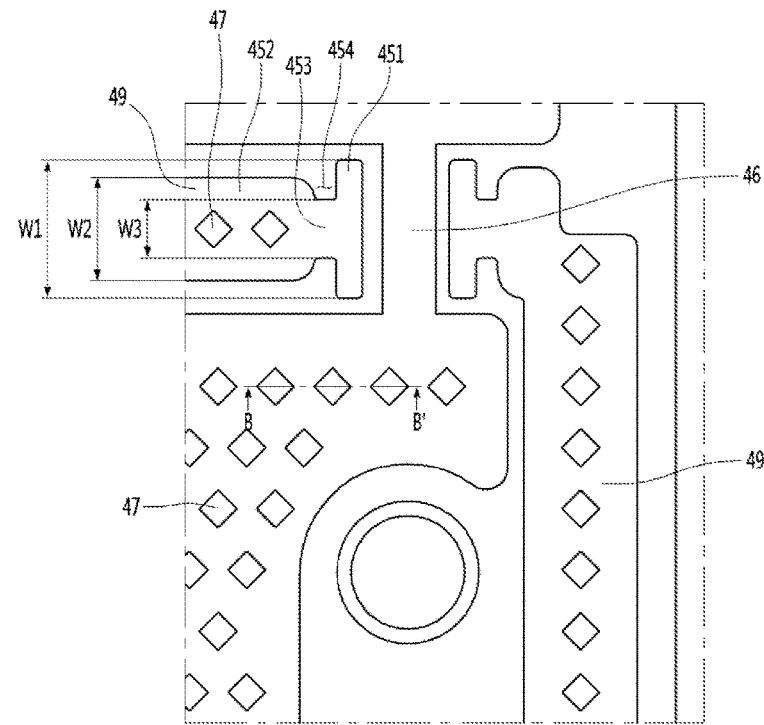
FIG. 14 is an enlarged view of any one portion at which the light source is placed in FIG. 13.

FIG. 14 is an enlarged view of any one portion at which the light source is placed in FIG. 13.

Referring to FIG. 14, any one end of one conductive unit body 49 may be opposite to another one end of another conductive unit body 49 with the bridge 46 interposed therebetween. Here, that the ends of the conductive unit bodies 49 are opposite to each other may mean that the ends of the conductive unit bodies 49 are positioned corresponding to each other to supply electric current to different electrodes of any one light source 11.

In order for the ends of the conductive unit bodies 49 to be opposite to each other, the conductive unit body 49 may include an extension part 452 extending in a direction in which a pair of light sources 11 are connected to each other, a connection part 451 electrically connected to an electrode of the light source 11, and a neck part 453 provided between the connection part 451 and the extension part 452. The neck part 453 may be defined as a part at which an insertion groove 454 is formed. Here, the insertion groove 454 is concavely provided as the width of the extension part 452 is reduced. The neck part 453 can prevent a problem such as a short circuit from occurring as a fluid material such as a solder paste flows during a process of connecting the light source 11 and the connection part 451 to each other. Accordingly, it is possible to prevent, in advance, a decrease in yield of products, which may occur because a reflow process is performed in a state in which the light source 11 is mounted on the heat sink 120.

The width W1 of the connection part 451 may be wider than the width W2 of the extension part 452. The width W3 of the neck part 453 may be narrower than the width W2 of the extension part 452.

As the width of the connection part 451 is greatest, it is possible to prevent a connection failure between the light source 11 and the conductive unit body 49. In addition, the amount of heat generation can be reduced by considering that a connection portion between component parts causes high resistance.

The neck part 453 may allow a solder paste applied on the bonding layer 50 not to flow along the conductive layer 40 during an application process or a reflow process. Accordingly, it is possible to prevent degradation of the performance of the conductive layer 40. Also, bonding is concentratedly performed at a lower portion of the light source 11, thereby ensuring the performance of the bonding layer 50. Also, the solder paste does not flow over the heat dissipation conductive layer 44, thereby preventing a short circuit.

The conductive layer 40 and the insulating layer 20 may be coupled to each other by means of the metal joint face 22. However, the conductive layer 40 may be separated from the insulating layer due to factors such as high-temperature environment, inadequacy of process conditions, and severe use environment. In this case, heat dissipation efficiency may be suddenly deteriorated. In order to solve this problem, in an embodiment, a plurality of islands 47 spaced apart from each other may be provided in the conductive layer 40 provided as a wide plane. The islands 47 increase coherence between the conductive layer 40 and the insulating layer 20, thereby improving the yield and lifespan of products.

Figure 15:
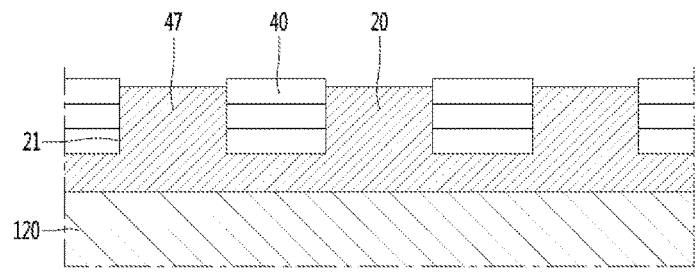
FIG. 15 is a sectional view taken along ling B-B' of FIG. 14.

FIG. 15 is a sectional view taken along ling B-B' of FIG. 14.

Referring to FIG. 15, the conductive layer 40 may be provided in a region in which the depression part 21 is formed. In addition, the conductive layer 40 is not provided in a region in which the depression part 21 is not formed, and the region, as a relative concept with respect to the depression part 21, may protrude upward of the depression part 21. The upwardly protruding region may be referred to as the island 47. The island 47 may be scattered in an internal region of the depression part 21 when viewed on a plane. When viewed in a two-dimensional planar structure, the island 47 is a region in which the insulating layer 20 having no conductive layer provided therein is exposed to the outside in the conductive layer 40 that may be defined as an internal region of a closed curve. The islands 47 may be arranged at a predetermined distance. Thus, the connection area between the conductive layer 40 and the island 47 is widened, and the coherence between the conductive layer and the island 47 is increased.

The reason why the separation between the heat sink 120 and the insulating layer 20 and the separation between the insulating layer 20 and the conductive layer 40 are prevented by the islands 47 will be described in detail.

In the reflow process, the temperature of an atmosphere reaches a few hundreds of degrees Celsius even though it is low. In this state, the conductive layer 40 expands according to a predetermined thermal expansion rate. Therefore, when viewed on a two-dimensional plane, the area of the conductive layer 40 increases. Although the area of the conductive layer 40 increases, the conductive layer is not bent laterally or downwardly. Hence, a force is applied to the conductive layer 40 in a direction in which the conductive layer 40 is lifted upwardly, i.e., in a direction in which the conductive layer 40 is separated from the insulating layer 20. The force may be referred to as a separation force.

The separation force is applied to both a first contact surface between the conductive layer 40 and the insulating layer 20 and a second contact surface between the insulating layer 20 and the heat sink 120. If a contact force of the first or second contact surface is weaker than the separation force, the corresponding contact surface may be separated.

The inventors have closely observed such a mechanical action and studied a method for removing the separation force. As a result, the inventors have found that when the conductive layer 40 expands, a configuration capable of accommodating the expansion of the conductive layer 40 is provided, thereby reducing the separation force.

More specifically, when the conductive layer 40 thermally expands, the islands 47 are contracted, thereby accommodating the expanding area of the conductive layer 40. Thus, when viewed one-dimensionally, the increased length of the conductive layer 40 between any one pair of islands 47 can be accommodated by contraction of the islands 47 made of a resin material, and the separation force can be reduced.

Accordingly, the separation force applied to both the first contact surface between the conductive layer 40 and the insulating layer 20 and the second contact surface between the insulating layer 20 and the heat sink 120 can be reduced. Thus, both the separation between the conductive layer 40 and the insulating layer 20 and the separation between the insulating layer 20 and the heat sink 120 can be reduced.

The island 47 may be provided in all regions in which the conductive layer is formed. For example, the island 47 may be provided in all regions in which the electrically conductive layer 45 and the heat dissipation conductive layer 44 are formed. In addition, the island 47 may be formed in a polygonal shape such as a triangle, a quadrangular shape, or a pentagonal shape. The island 47 may have a shape in which the coherence between the island 47 and the conductive layer 40 can be increased. In an embodiment, the island 47 may have a quadrangular shape.

Figure 16:
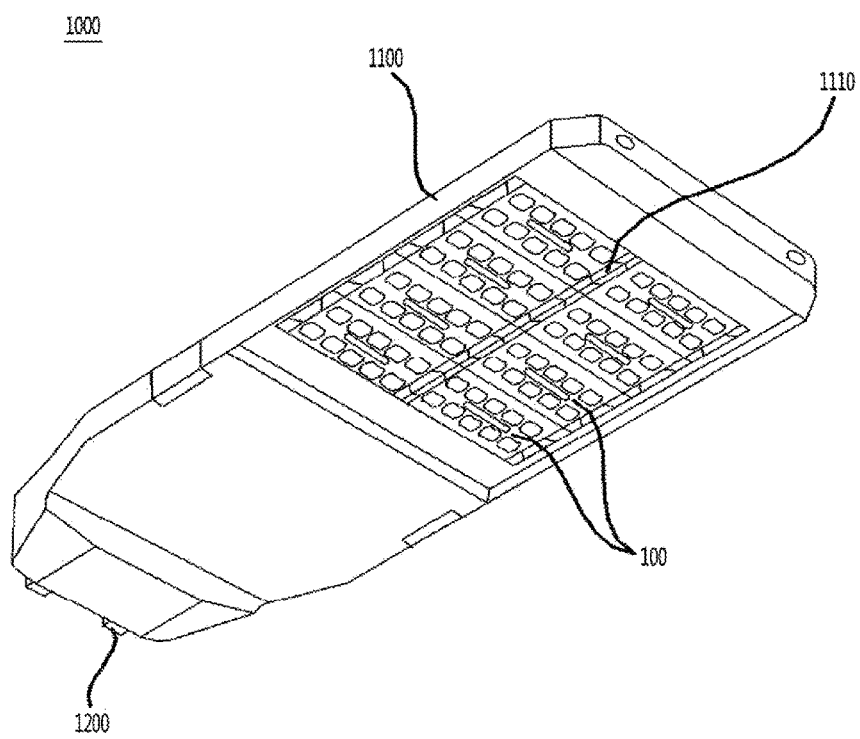
FIG. 16 is a perspective view of a lighting device including light source modules according to an embodiment.

FIG. 16 is a perspective view of a lighting device including light source modules according to an embodiment.

Referring to FIG. 16, the lighting device 1000 according to the embodiment may include a main body 1100 providing a space in which lighting modules 100 are coupled thereto, the main body 1100 forming an external appearance, and a connection part 1200 having a built-in power source (not shown) coupled to one side of the main body 1100 to supply power, the connection part 1200 connecting the main body 1100 to a supporting part (not shown). The lighting device 1000 according to the embodiment may be installed indoors or outdoors. For example, the lighting device 1000 according to the embodiment may be used as a streetlight. The main body 1100 may be provided with a plurality of frames 1110 capable of providing a space in which at least two light source modules 100 are positioned. The connection part 1200 has the power source (not shown) built therein and connects the main body 1100 to the supporting part (not shown) fixing the main body 1100 to the outside.

If the lighting device 1000 according to the embodiment is used, heat generated by the light source modules 100 can be effectively cooled due to a chimney effect. Further, a separate fan is not used, and thus fabrication cost can be reduced.

A light source module according to another embodiment.

In the light source module according to the above-described embodiment, in order to provide the heat dissipation conductive layer 44 and the electrically conductive layer 45, it takes much time to perform the LDS. Moreover, in order to provide the conductive layer 40, a large amount of metal is used, and therefore, fabricating cost is increased. Such disadvantages may cause an increase in unnecessary cost when the amount of heat generated from the light source is small.

In the following another embodiment, the heat dissipation conductive layer is not provided so as to solve the above-described problem. It will be apparent that many portions of the description of the above-described embodiment may be applied to the following another embodiment as they are. Therefore, portions to which the above-described embodiment is not applied will be mentioned, and the above-described embodiment will be applied, as it is, to portions not particularly mentioned.

Figure 17:
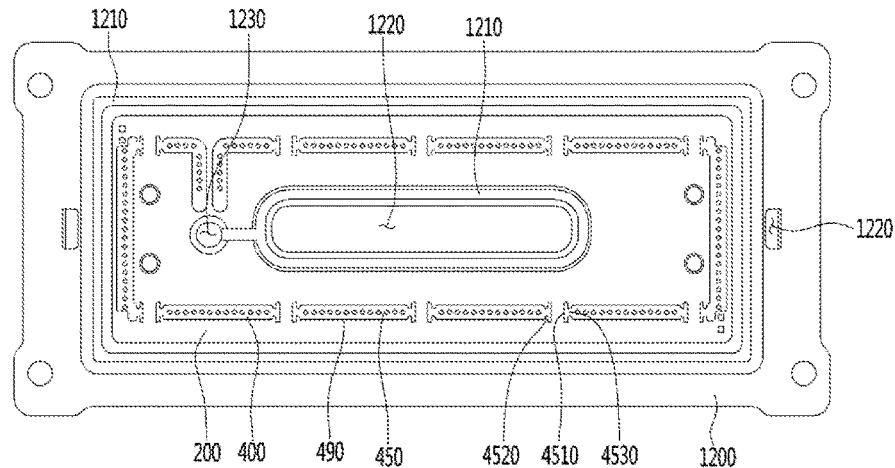
FIG. 17 is a plan view of a heat sink according to another embodiment.

FIG. 17 is a plan view of a heat sink according to the another embodiment.

Referring to FIG. 17, a conductive layer 400 is provided in the heat sink 1200 according to the another embodiment, and the heat dissipation conductive layer (see 44 of the above-described embodiment) is not provided in the conductive layer 400. Thus, the conductive layer 400 serves as an electrically conductive layer 450, thereby supplying power to a light source.

The conductive layer 400 as the electrically conductive layer 450 supplies power to the light source, and may further perform a function of diffusing heat such that the effect of heat dissipation can be enhanced. According to the present disclosure, the heat dissipation efficiency of the light source module can be further improved, and there is no problem in heat dissipation performance even when an insulating layer 200 is formed thick. In addition, unlike the above-described embodiment, since the heat dissipation conductive layer is not provided, the use of precious metal can be reduced, and the processing time required to perform a laser process and a plating process can be reduced. Thus, unlike the above-described embodiment, fabrication cost can be reduced, and the processing time can be shortened.

The electrically conductive layer 450 may provide a path through which electric current applied from the outside flows. A conductive unit body 490 capable of connecting light sources to each other may perform a function of connecting between the light sources. The conductive unit body 490 may serve as one unit body connecting a pair of a power supply line and a light source to each other. Also, the conductive unit body 490 may be provided with a predetermined thickness and width to provide a path through electric current flows.

The conductive unit body 490 may include an extension part 4520 extending in a direction in which a pair of light sources are connected to each other, a connection part 4510 connected in a state in which it is electrically connected to each electrode of the light source, and a neck part 4530 provided between the connection part 4510 and the extension part 4520. The neck part 4530 may be defined as a part at which an insertion groove 4540 is formed. Here, the insertion groove 4540 is concavely provided as the width of the extension part 4520 is reduced. The neck part 4530 can prevent a problem such as a short circuit from occurring as a fluid material such as a solder paste flows during a process of connecting the light source and the connection part 4510 to each other.

Accordingly, it is possible to prevent, in advance, a decrease in yield of products, which may occur because a reflow process is performed in a state in which the light source is mounted on the heat sink 1200.

An air hole 1220 is provided at an approximately central portion of the heat sink 1200 to enable external air to flow. Accordingly, the heat dissipation performance of the heat sink 1200 can be improved.

A wire hole 1230 through which wires for supplying power to the light source pass may be formed in the heat sink 1200. The wires passing through the wire hole 1230 are respectively fastened to a pair of adjacent conductive unit bodies 490 to supply power to the light source.

The conductive unit body 490 and the light source are electrically connected to each other on a mounting part. Accordingly, the conductive unit body 490 and the light source can physically form an electrical closed circuit. In other words, the wires passing through the wire hole 1230 are respectively connected to a pair of conductive unit bodies 490, and the conductive unit bodies 490 and the light source are connected to each other, to form an electrical closed circuit on the mounting part.

The heat sink 1200 may be provided in an approximately rectangular shape. A mounting groove 1210 may be formed in the shape of a closed curve in one surface (e.g., an upper surface) of the heat sink 1200. The mounting groove 1210 may be formed as a top surface of the heat sink 1200 is depressed. A lens cover (see 1420 of FIG. 20) may be mounted in the mounting groove 1210. A rib 1440 (see FIG. 22) of the lens cover 1420 is inserted into the mounting groove 1210, thereby providing a waterproof structure. The light source can be waterproofed against external environment by coupling between the mounting groove 1210 and the rib 1440.

A sealer 1260 (see FIG. 22) such as silicon may be applied to the mounting groove 1210 when the rib 1440 is inserted into the mounting groove 1210. The sealer 1260 is provided as an interface between the rib 1440 and the mounting groove 1210, so that the stability of the waterproof structure can be further improved.

The mounting groove 1210 may be provided at both the inside and the outside of the conductive layer 400. In other words, when the top surface of the heat sink 1200 is observed as a two-dimensional plane, the mounting groove 1210 can block both water that may be introduced inward from the outside of the light source and water that may be introduced inward from the inside of the light source (i.e., from the air hole 1220).

Hook holding part 1220 may be provided at two portions of the heat sink 1220, which are opposite to each other. A hook 1450 of the lens cover 1420 is held by the hook holding part 1220, so that the lens cover 1420 is fixed to the heat sink 1200. It is unnecessary for a worker to fix the lens cover 1420 to the heat sink 1200 while the sealer 1260 is being fixed by the holding action of the hook 1450 and the hook holding part 1220.

Figure 21:
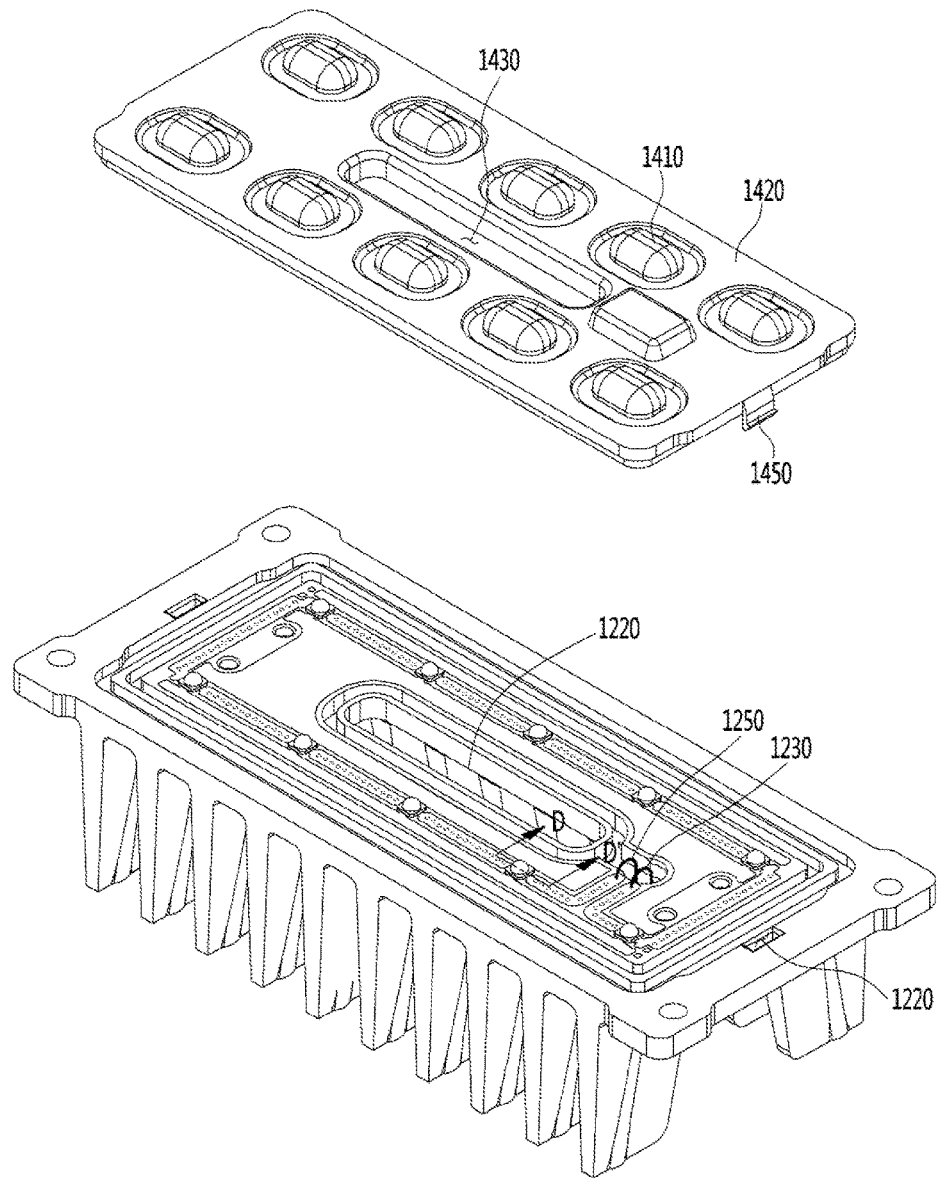
FIG. 21 is an exploded perspective view of a lens cover and the heat sink according to the another embodiment.

FIG. 21 is an exploded perspective view of the lens cover and the heat sink according to the another embodiment.

Referring to FIG. 21, light sources 110 are mounted on the heat sink 1200, and the lens cover 1420 is aligned with the heat sink 1200.

The air hole 1220 of the heat sink 1200 and a cover hole 1430 of the lens cover 1420 are aligned with each other, so that a cooling action can be smoothly performed as external air passes therethrough.

Two wires 1250 for supplying power pass through the wire hole 1230, and may be connected to a pair of conductive layers 400, respectively. The structure of the light source module is compactly configured by the insulating layer and the conductive layer, so that the wire 1250 can be directly connected to the conductive layer 400. For convenience of insertion, the wire hole 1230 may be provided in a circular shape.

A heat dissipation fin 1300 may be provided under the heat sink 1200 to improve heat dissipation efficiency.

Lenses 1410 respectively corresponding to the light sources 110 may be provided in the lens cover 1420.

Figure 19:
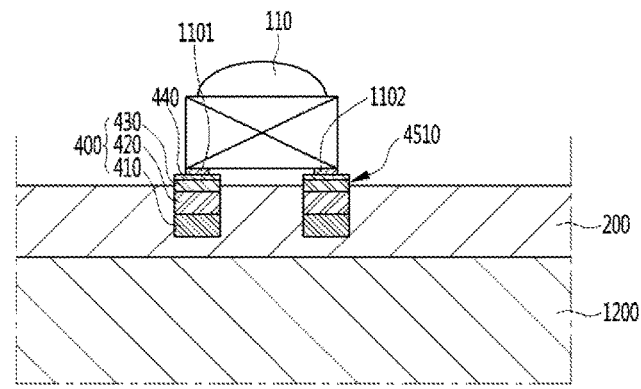
FIG. 19 is a sectional view taken along line D-D' of FIG. 21.

FIG. 19 is a sectional view taken along line D-D' of FIG. 21.

Referring to FIG. 19, based on the sectional view, the heat dissipation fin 1300 extends downward from the heat sink 1200, and the insulating layer 200 is placed on the heat sink

1200. Like the above-described embodiment, the conductive layer 400 is provided in a portion at which the insulating layer 200 is depressed.

The configuration of the conductive layer 400 will be described in detail. A part illustrated as the conductive layer 400 in FIG. 19 may represent the connection part 4510 of FIG. 17. This is because the light source 110 is connected to the conductive layer 400 or the connection part 4510 of the conductive unit body 490 such that power is supplied to the light source 110.

Like the above-described embodiment, a metal joint face may be processed in an inner surface formed as the insulating layer 200 is depressed.

The conductive layer 400 may be stacked on the metal joint face. At least one plating layer may be stacked in the conductive layer 400. For example, the conductive layer may include a first plating layer 410 made of copper, a second plating layer 420 made of nickel, and a third plating layer 430 made of gold or silver. The first plating layer 410 may be stacked to a thickness of 10 to 20 μm. The second plating layer 420 may be stacked to a thickness of 5 to 15 μm. The third plating layer 430 may be stacked to a thickness of 0.1 μm or so. The third plating layer 430 may cause an increase in material cost. Therefore, the third plating layer 430 may not be stacked. However, the third plating layer 430 may be provided as a thin film for anti-oxidation and protection.

The first plating layer 410 placed at the lowermost side of the conductive layer 400 serves as an electroconductive functional layer that can reduce the amount of heat generation by reducing electrical resistance. To this end, the first plating layer 410 may be made of copper. In order to ensure sufficient electrical conductivity, the first plating layer 410 may be formed thickest among the plating layers. The first plating layer 410 may be made of a metal having a high electrical conductivity as well as the copper.

The second plating layer 420 placed in the middle of the conductive layer 400 serves as a soldering functional layer that improves the quality of soldering. In order to perform soldering, it is necessary for a melted solder to be well wettable on the entire surface of a base material and to be well spread on the surface of the base material. The second plating layer 420 may be made of nickel as a metal for ensuring characteristics of the soldering.

The third conductive layer 430 placed at the uppermost side of the conductive layer 400 serves as a protective functional layer for protecting the plating layers 410 and 420 thereinside. The third plating layer 430 may be made of gold that is not oxidized or discolored. In the case of silver, the silver may be discolored LED package. Also, the silver may penetrate into an LED package and chemically react with internal component parts of a light emitting part, thereby degrading light emitting efficiency. Since the third plating layer 430 performs a function of protection, the third plating layer 430 may be provided as the thinnest layer. The second plating layer 420 is not provided, and only the third plating layer 430 may be provided, which is not preferable in terms of cost. Since the third plating layer 430 is provided as a considerably thin layer, the third plating layer 430 does not interfere with the function of the second plating layer 420 in the soldering.

The third plating layer 430 may be provided as resin. In this case, the resin may be stacked through another technique instead of a plating technique. The resin is not covered at a portion on which the soldering is performed, so that the soldering cannot be interfered with by the resin.

A bonding layer 440 may be provided on the conductive layer 400. The light source 110 may be placed on the bonding layer 440. The bonding layer 440 may include a low-temperature solder paste with which soldering can be performed at a low temperature. For example, the bonding layer 440 may include OM525. The bonding layer 440 may be provided by allowing the low-temperature solder paste to pass through a reflow machine in a state in which a light emitting device is mounted on the low-temperature solder paste. The soldering is performed at the low temperature, so that it is possible to prevent separation between two of the heat sink 1200, the insulating layer 200, and the conductive layer 400. Accordingly, it is possible to improve the reliability and yield of products can be improved and to prevent the deterioration of a material, caused by long-term use.

In the entire structure, the parts at which the bonding layer 440 contacts the light source 110 may be provided as electrodes 1101 and 1102 of two bottom surfaces of the light source 110, which are spaced apart from each other. Since the electrode pads 1101 and 1102 are sufficiently spaced apart from each other, it is possible to prevent a short circuit in bonding of electrodes.

Specifically, a separate pad connected to the heat dissipation conductive layer of the above-described embodiment may not be provided. Thus, as can be seen in the above-described embodiment, the problem in that two pads among the three pads are connected to each other by the solder paste does not occur. Accordingly, the yield of products can be improved FIG. 18 is a perspective view of the light source.

Figure 18:
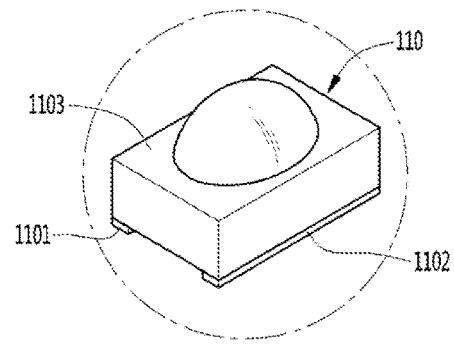
FIG. 18 is a perspective view of a light source.

Referring to FIG. 18, the light source 110 includes a chip which may be exemplified as an LED, a light source main body 1103 provided at a portion at which a package having the chip mounted therein is placed, and a first electrode pad 1101 and a second electrode pad 1102, which are provided to be spaced apart from each other on the bottom of the light source main body 1103.

The electrode pads 1101 and 1102 may respectively contact connection parts of different conductive unit bodies 490 to receive power. Accordingly, the light source 110 can emit light.

Meanwhile, the electrode pads 1101 and 1102 may be provided to have a large distance therebetween. Thus, it is possible to prevent a defect from occurring as the electrode pads are connected to each other by the solder paste in a bonding process of electrodes.

Figure 20:
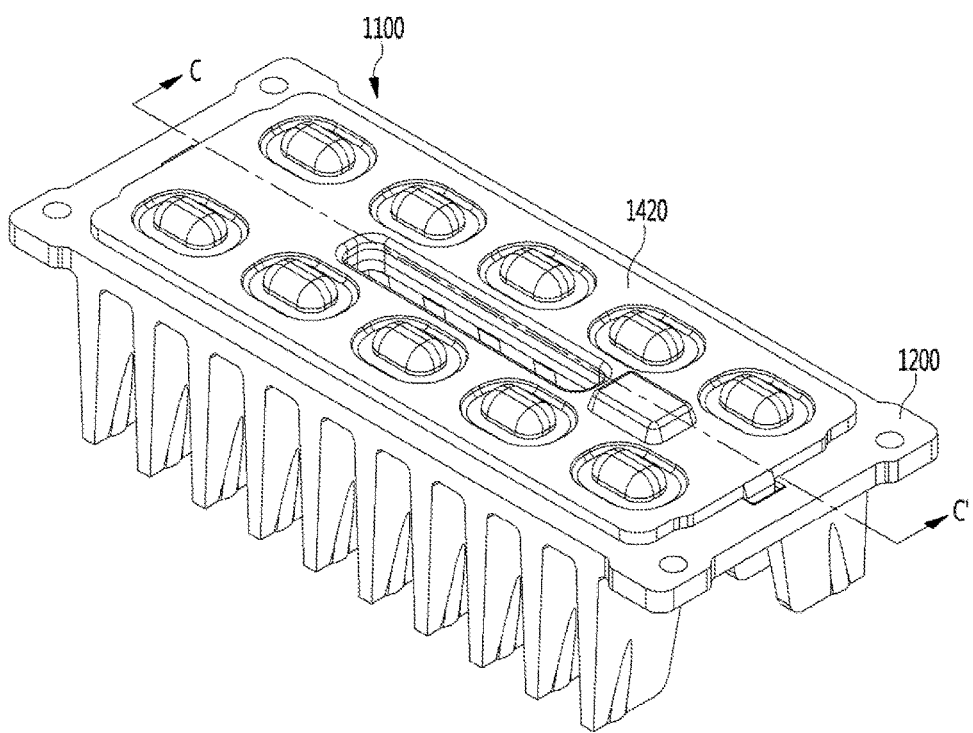
FIG. 20 is a perspective view of a light source module according to the another embodiment.
Figure 22:
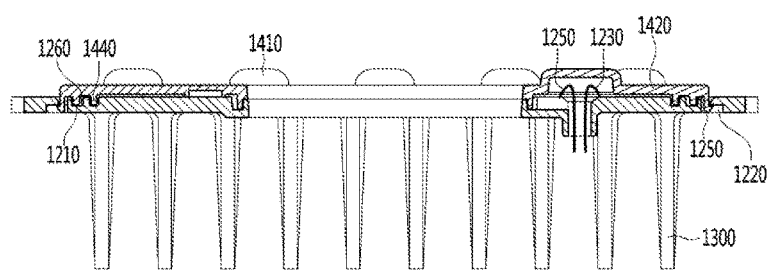
FIG. 22 is a sectional view taken along line C-C' of FIG. 20.

FIG. 20 is a perspective view of the light source module according to the another embodiment. FIG. 22 is a sectional view taken along line C-C' of FIG. 20.

Referring to FIGS. 20 and 22, the lens cover 1420 is fastened to an upper portion of the heat sink 1200. At this time, the heat sink 1200 and the lens cover 1420 can be firmly fastened to each other by the hook 1450 and the hook holding part 1220.

The wires 1250 is inserted through the wire hole 1230 vertically opened in the heat sink 1200. The wires 1250 may be connected to a pair of conductive unit bodies adjacent to the wire hole 1230, respectively. After the wires 250 pass through the wire hole 1230, a sealing member is inserted into the wire hole 1230 to block foreign matters from the outside from being introduced.

The rib 1440 and the mounting groove 1210 are provided in an uneven structure in which they correspond to each other, so that they are engaged with each other, thereby performing sealing on the foreign matters from the outside. In addition, the sealer 1260 is applied to a contact surface between the rib 1440 and the mounting groove 1210, so that the introduction of external foreign matters through the contact surface can be completely prevented.

According to the present disclosure, due to effects such as rapid fabrication processes, inexpensive fabrication cost, facilitation of mass production, and improvement of product yield, many advantages can be expected in the production of lighting devices. Particularly, products can be inexpensively fabricated at high speed. Thus, it is possible to promote the spread of lighting devices using light emitting diodes.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light source module comprising:
   at least one light source configured to emit light;
   a heat sink configured to absorb heat from the light source and dissipate the heat to the outside;
   a mounting part provided at a first side of the heat sink, the light source being mounted at the mounting part;
   a heat dissipation fin provided at a second side of the heat sink to absorb heat generated by the light source and dissipate the heat to the outside;
   an insulating layer applied to at least one surface of the heat sink at the mounting part;
   an electrically conductive layer applied to at least one portion of the insulating layer, the electrically conductive layer providing a path for a flow of electric current to the light source; and
   a lens cover provided over the light source,
   wherein the insulating layer is made of a resin material, and
   wherein the electrically conductive layer is formed by processing a portion of the insulating layer using a laser to form a groove, and a conductive metal is disposed in the groove.

2. The light source module according to claim 1, further comprising a metal joint face provided at a surface where the conductive layer contacts the insulating layer.

3. The light source module according to claim 1, further comprising a wire connected to the electrically conductive layer for applying external power.

4. The light source module according to claim 1, wherein the electrically conductive layer comprises at least two conductive unit bodies spaced apart from each other.

5. The light source module according to claim 4, wherein the at least one light source comprises a first light source and a second light source,
   wherein one electrode of the first light source is connected to a first end portion of one of the conductive unit bodies, and
   wherein one electrode of the second light source is connected to a second end portion of the one of the conductive unit bodies.

6. The light source module according to claim 4, wherein each of the conductive unit bodies comprise:
   an extension part;
   a connection part disposed at an end portion of the extension part to be connected to the light source; and
   a neck part located between the extension part and the connection part, the neck part having a width narrower than a width of the connection part.

7. The light source module according to claim 1, wherein the electrically conductive layer comprises at least two conductive unit bodies spaced apart from each other, and
   wherein the conductive unit bodies and the light source are connected to each other to provide an electrical closed circuit for an external power supplied thereto.

8. The light source module according to claim 7, wherein the conductive layer comprises at least two stacked plating layers located in a depression part provided in the insulating layer.

9. The light source module according to claim 1, wherein the electrically conductive layer contacts the insulating layer.

10. The light source module according to claim 1, wherein the insulating layer is provided on an entire surface of the heat sink.

11. The light source module according to claim 1, wherein the insulating layer is interposed between the electrically conductive layer and the heat sink.

12. The light source module according to claim 1, wherein the insulating layer comprises a groove, and
    wherein the electrically conductive layer is a conductive metal disposed in the groove.

13. A light source module comprising:
    at least one light source configured to emit light;
    a body supporting the light source; and
    a lens cover fastened to a surface of the body such that light emitted from the light source is transmitted therethrough,
    wherein the body comprises:
    a heat sink configured to absorb heat from the light source and dissipate the heat to the outside;
    an insulating layer applied to at least one surface of the heat sink; and
    an electrically conductive layer applied to at least one portion of the insulating layer to provide a path for a flow of electric current to the light source,
    wherein the heat sink comprises:
    a heat dissipation fin extending from the heat sink;
    an air hole extending through the heat sink for allowing air to pass through the heat sink; and
    a wire hole extending through the heat sink for allowing a wire connected to the electrically conductive layer to pass therethrough,
    wherein the lens cover comprises a lens corresponding to the light source to diffuse light emitted from the light source,
    wherein the insulating layer is made of a resin material, and
    wherein the electrically conductive layer is formed by processing a portion of the insulating layer using a laser to form a groove, and a conductive metal is disposed in the groove.

14. The light source module according to claim 13, further comprising a metal joint face provided at a surface where the conductive layer contacts the insulating layer.

15. The light source module according to claim 13, wherein the electrically conductive layer comprises at least two conductive unit bodies spaced apart from each other.

16. The light source module according to claim 13, wherein the light source comprises:

a light source main body; and two electrode pads provided on a bottom side of the light source main body, the electrode pads being connected to the electrically conductive layer.

17. The light source module according to claim 16, wherein the interface between the electrode pads and the insulating layer comprises:

a first plating layer to which electric current is supplied;

a second plating layer provided on the first plating layer to improve a bonding yield;

a third plating layer provided on the second plating layer to protect the first plating layer and the second plating layer; and a bonding layer interposed between the third plating layer and the electrode pads.

18. A light source module comprising:

at least one light source configured to emit light;

a heat sink configured to absorb heat from the light source and dissipate the heat to the outside;

a mounting part provided at a first side of the heat sink, the light source being mounted at the mounting part;

a heat dissipation fin provided at a second side of the heat sink to absorb heat generated by the light source and dissipate the heat to the outside;

an insulating layer applied to at least one surface of the heat sink at the mounting part;

an electrically conductive layer applied to at least one portion of the insulating layer, the electrically conductive layer providing a path for a flow of electric current to the light source;

a lens cover provided over the light source;

a first mounting groove provided in the mounting part, the first mounting groove having a closed curve shape and located inwardly of the electrically conductive layer;

a second mounting groove provided in the mounting part, the second mounting groove having a closed curve shape and located outwardly of the electrically conductive layer;

a first rib provided on the lens cover at a location corresponding to the first mounting groove; and a second rib provided on the lens cover at a location corresponding to the second mounting groove, wherein the insulating layer is made of a resin material, and wherein the electrically conductive layer is formed by processing a portion of the insulating layer using a laser to form a groove, and a conductive metal is disposed in the groove.

19. The light source module according to claim 18, further comprising:

a hook provided on the lens cover; and a hook holding part provided on the heat sink and configured to hold the hook such that the lens cover and the heat sink are fastened to each other.

20. The light source module according to claim 18, further comprising an air hole extending through the heat sink for allowing air to pass through the heat sink, wherein the first mounting groove is located along an edge of the air hole.

* * * * *